United States Patent [19]

Lee et al.

[11] Patent Number: 5,112,926
[45] Date of Patent: May 12, 1992

[54] THERMAL-RESISTANT RESIN COMPOSITION FOR PRINTED CIRCUIT BOARDS BASED ON TRIAZINE MODIFIED EPOXY RESIN BLENDS

[75] Inventors: Tzong-Ming Lee; Ker-Ming Chen, both of Hsin Chu Hsien, China

[73] Assignee: Industrial Technology Research Institute, Hsin Chu Hsien, Taiwan

[21] Appl. No.: 682,407

[22] Filed: Apr. 8, 1991

Related U.S. Application Data

[63] Continuation of Ser. No. 294,792, Jan. 9, 1989, abandoned.

[51] Int. Cl.$^5$ ............................................. C08G 59/32
[52] U.S. Cl. .................................... 525/526; 525/527; 528/96; 528/102; 528/118
[58] Field of Search ............... 525/526, 527; 528/96, 528/102

[56] References Cited

U.S. PATENT DOCUMENTS

| | | | |
|---|---|---|---|
| 2,893,978 | 7/1959 | Cooke | 528/96 |
| 2,947,726 | 8/1960 | Belanger | 528/407 |
| 4,665,149 | 5/1987 | Bertram et al. | 528/96 |

FOREIGN PATENT DOCUMENTS

| | | | |
|---|---|---|---|
| 6100825 | 8/1981 | Japan | 525/409 |
| 0197738 | 10/1985 | Japan | 525/526 |
| 3301221 | 12/1988 | Japan | 528/102 |
| 3305122 | 12/1988 | Japan | 528/102 |

OTHER PUBLICATIONS

Translation of Japan 63-305,122, already of record untranslated.
Translation of Japan 63-301,221, already of record untranslated.

*Primary Examiner*—John C. Bleutge
*Assistant Examiner*—Frederick Krass
*Attorney, Agent, or Firm*—Cushman, Darby & Cushman

[57] ABSTRACT

This invention provides a epoxy resin composition for structual substrate of PCB comprising a triazine-modified bisphenol A epoxy resin reacted with a multi-functional epoxy resin, a brominated epoxy resin, a curing agent and a curing promoter to form a cured product with excellent thermal resistance (Tg is about 170°-220° C. and mostly higher than 180° C.) as well as good drilling properties and good toughness.

Besides, it has comparable electrical and physical properties as the commercially available FR-4 printed circuit boards.

14 Claims, No Drawings

THERMAL-RESISTANT RESIN COMPOSITION FOR PRINTED CIRCUIT BOARDS BASED ON TRIAZINE MODIFIED EPOXY RESIN BLENDS

This is a continuation of application Ser. No. 07/294,792, filed on Jan. 9, 1989, which was abandoned.

BACKGROUND OF THE INVENTION

This invention relates to a novel epoxy resin composition to be employed as a structural substrate of printed circuit boards. Due to that the trend of fact the electronic devices is characterized by one toward small size, high density and high reliability in recent years, the requirements of printed circuit board substrate thus tend to be of high thermal resistance and electrical insulation. The substrate material for printed circuit boards now in use, however, known as FR-4, with a glass transition temperature (Tg) of about 110° C. can not meet the above requirements. Though the printed circuit board based on bis-maleimide, the so called addition type polyimide, has very high thermal resistance, it has not yet replaced FR-4 PCB consumer products because of its high cost. Therefore, epoxy resin with high Tg provides a potential solution to the problems because of its low price and excellent electrical properties.

In prior literature and patents, there are many reports concerning the improvement of electrical processing, thermal and mechanical properties on epoxy based printed circuit boards. However, the improvement was achieved at the expense of some other properties. The main prior art patents include U.S. Pat. Nos. 4,559,395, 4,645,803, 4,550,051, 4,529,790, 4,594,291, 2,947,726, 2,971,942, and 2,809,942. According to U.S. Pat. No. 4,559,395, an effective amount of amine having an aryl ring in structure, and 2.5-10 wt. % of dicyandiamide, is added to a mixture of two epoxy resins, hence a cured product with Tg at about 150° C. is obtained. In U.S. Pat. No. 4,594,291, the bisphenol-A epoxy resin is modified by a chain extender with two active hydrogens. Then an acidic or amine type curing agent or curing promoter is added to form a thermal resistant (i.e. high glass transition temperature) resin composition. In those reports, the epoxy resins adopted for printed circuit boards are all multifunctional epoxy resins, such as novolac expoxy resin, tetrakis (hydroxy phenyl) ethane, or tetraglycidyl ether, to increase the degree of cross linking. However, the prior arts reported in these literature have the following defects:

1. With the degree of cross linking increased, the hardness will also be raised. Therefore, the life of the drill heads will be decreased so that operating cost will be increased.
2. As the degree of cross linking increases, the stiffness or toughness of cured products and the adhesion to copper clad will decrease.
3. Though the stiffness or toughness of cured products could be enhanced by the addition of chain-extended bisphenol-A epoxy resin with higher molecular weight, the employment of such epoxy resins would also have serious negative effects on glass transition temperature (Tg) and result in the formation of smears during the drilling process.

SUMMARY OF THE INVENTION

The objects of the present invention are to eliminate the above-mentioned disadvantages and to provide an epoxy resin composition containing triazine rings, as those found in B-T resins, on the chain backbone to upgrade its thermal stability.

The epoxy resin composition of this invention has glass transition temperatures between 170° C. and 220° C. with little smear formation, and its electrical properties and processibility are comparable to those of the conventional FR-4 resins.

The present invention provides an epoxy resin composition comprising a triazine-modified bisphenol-A epoxy resin, reacted with a multifunctional epoxy resin, a brominated epoxy resin, a curing agent and a curing promoter, and can be used to fabricate cured products with excellent thermal resistance (Tg is about 170°-220° C., and mostly higher than 180° C.).

Meanwhile, good drilling properties and toughness are found in the final products.

The composition of this invention comprising:

1. A triazine-modified bisphenol-A epoxy resin as the major component.
2. A brominated bisphenol-A epoxy resin serving as a flame-retardant.
3. A multifunctional epoxy resin added to enhence the crosslinking density and thermal stability.
4. One or more curing agents which may react with the epoxide group to give a crosslinking structure.
5. One or more curing promoters which may catalyze or accelerate the curing reactions.
6. A solvent system which may dissolve the resins and act as a carrier of the resin composition.

A difunctional epoxy resin is first reacted with a chain extender then mixed with a multifunctional epoxy resin and a brominated epoxy resin. The mixture is then mixed with curing agent, curing promoter and solvents to give a varnish, which is used to impregnate the woven glass cloth through a treating process to give B-stage prepregs. Then the treated glass cloth prepregs are laminated with copper clad to form a thermal-resistant printed circuit board laminate.

The present invention has the following advantages and is suitable for high-performance printed circuit board usage.

1. It has good thermal stability, i.e. its glass transition temperature (Tg) is higher than 180° C. whereby it can withstand high operational temperatures.
2. It has enhanced dimensional stability whereby the PCB formed by this composition will not deform under unfavorable environmental conditions.
3. Its electrical and flame retardant properties can meet the requirements of FR-4 materials for printed circuit boards.
4. Excellent adhesion is found between the copper clad and resin substrate and delamination problems can be avoided during soldering process.
5. Because of its good toughness, this composition has very good drilling properties, and very little smear is generated after hole drilling.

DETAILED DESCRIPTION OF THE INVENTION

This invention relates to a resin composition for high performance printed circuit boards. In more detailed description, this composition has excellent thermal stability, good drilling properties and dimensional stability. Meanwhile, this composition has electrical and flame retarding properties comparable to FR-4 materials for printed circuit boards.

The components of the composition of this invention may be devided into the following groups:
1. A triazine modified epoxy resin.
2. A brominated bisphenol-A epoxy resin.
3. A multifunctional epoxy resin.
4. One or more curing agents.
5. One or more curing promoters.
6. A solvent system for resin mixture.

The triazine modified epoxy resin is obtained from the following reactions:
1. A low equivalent weight bisphenol-A epoxy resin with each molecular chain containing at least two reactive epoxide groups, has the formula:

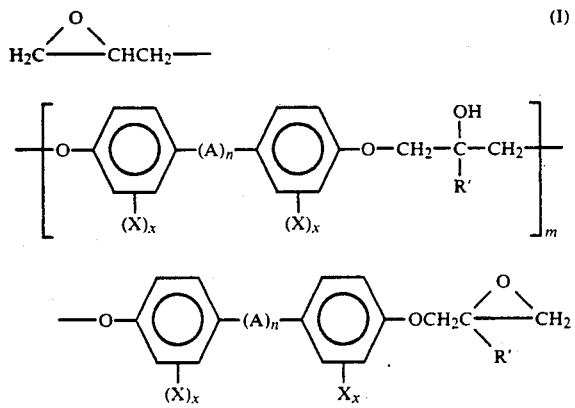

wherein A is a divalent alkylene group with 1-10 carbon atoms, or a functional group such as

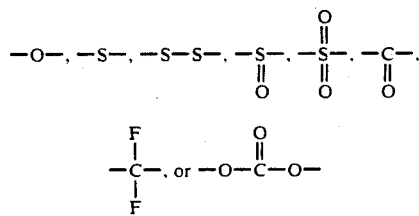

X is a monovalent alkyl group with 1-10 carbon atoms, or halide; m is a number mostly from 0 to 10; n is 0 or 1; X is a number from 0 to 4; R' is a hydrogen atom or alkyl group with 1-4 carbon atoms.

Other suitable epoxy resins also include aliphatic epoxy resins such as 3,4-epoxy cyclohexylmethyl-3,4-epoxy cyclo hexane carboxylate, vinyl cyclohexene diepoxide etc., and the mixtures thereof.

2. A chain extender (II) containing at least three active hydrogen groups to react with epoxy groups. The chain extender has the following formula:

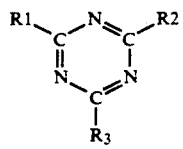

wherein R1, R2 and R3 may be —OH or —NH2; or R1 and R2 are —NH2, and R3 is a hydrogen atom, or a monovalent alkyl group with 0-10 carbon atoms, or a tertiary or secondary amine.

The suitable compounds include cyanuric acid 2,4-diamino-6-methyl-5-triazine, 2,4-diamino-4-phenyl-1,3,5-triazine, melamine and N,N-diallylmelamine, and mixtures thereof, with the most preferable being cyanuric acid.

3. One or more catalysts for chain extending reactions includes quaternary phosphonium or quaternary ammonium compounds, including ethyl triphenyl phosphonium chloride, ethyl triphenyl phosphonium bromide, ethyl triphenyl phosphonium iodide, ethyl triphenyl phosphonium acetate, ethyl triphenyl phosphonium diacetate, ethyl triphenyl phosphonium tetrahaloborate, tetrabutyl phosphonium chloride, tetrabutyl phosphonium bromide, tetrabutyl phosphonium iodide, tetrabutyl phosphonium acetate, tetrabutyl phosphonium diacetate, tetrabutyl phosphonium tetraborate, butyl triphenyl phosphonium tetrabromo bisphenate, butyl triphenyl phosphonium bisphenates, butyl triphenyl phosphonium bicarbonate, benzyl trimethyl ammonium chloride, benzyl trimethyl ammonium hydroxide, benzyl trimethyl ammonium tetrahaloborate, tetramethyl ammonium hydroxide, tetrabutyl ammonium hydroxide, and tetrabutyl ammonium tetrahaloborate and mixtures thereof.

The catalysts also include tertiary amines, including triethyl amine HCl complex, triethyl amine HBr complex, triethyl amine, HI complex, triethyl amine, tetrahaloboric acid complex, tributyl amine, HCl complex, tributyl amine, HBr complex, tributyl amine, HI complex, tributyl amine, tetrahaloboric acid complex, N,N-dimethyl-1,2-diaminoethane-tetra haloboric acid complex, triethyl amine, triethanol amine, and benzyl dimethyl amine, and mixtures thereof.

The ratio of the equivalent weight of active hydrogen to that of epoxide group is preferably 0.25-0.75. The amount of catalyst for chain extending reacting is 0.00005 to 0.1 mole per equivalent weight of epoxy group. Most preferable amount is 0.00075 to 0.0025.

The viscosity of the extended product will be 1-10 times that of the mixed solution before reaction, and the most preferable ratio is 1.25-4.5. The percentage of modified epoxy resin in the total resin content of cured composition is 10-100%, and preferably 25-50%.

Besides the difunctional epoxy resin, chain extender and catalyst as described above for the modified bisphenol-A epoxy resin, this invention also compresses a brominated epoxy resin which may be tetrabromo bisphenol-A epoxy resin, tetrabromo bisphenol-A-bisphenol-A epoxy resin, or tetrabromo bisphenol-A polyhydroxy aromatic compound epoxy resin. The bromine content of the composition ranges from 10% to 50% based on weight, and preferably 18-22% to the whole composition. Its equivalent weight is 330-1500, and preferably 330-575. The weight percentage of the brominated epoxy resin in the total resin content of the cured composition is 10-50%, and preferably 20-40%.

Besides the modified epoxy resin and the brominated epoxy resin as described above, this invention also consists of one or more multifunctional epoxy resins, such as N,N,N',N'-tetrakis-(2,3-epoxy propyl)-P,P'-methylene dianiline, N,N-bis(2,3-epoxy propyl)-4-amino-phenyl gly cidyl ether. N,N,N',N'-tetraglycidyl-4,4-diamino diphenyl methane, 1,1,2,2,-tetrakis-(2,3-epoxy propoxyphenyl) ethane, N,N,N',N'-tetraglycidyl-m-xylylene diamine, 1,3-bis CN,N-digly cidyl amino methyl, cyclo hexane, triglycidyl ether of triphenylene methane, and 4-glycidyloxy-N,N-diglycidyl aniline etc., and mixtures thereof.

This multifunctional epoxy resin should consist at least 3 expoxide groups and its weight ratio to the modified epoxy resin is 0.5-5.0, with the most preferable ratio being 1.0-2.0.

Besides modified epoxy resin, brominated epoxy resin and multifunctional epoxy resin, this invention also comprises one or more curing agents which will react with the above resins to form a cross linking structure. The curing agents used in this invention include primary and secondary amines, polyamides, mercaptans, carboxylic acids, carboxylic acid anhydrides, quanidine, biquanidines and aromatic sulfonic acid amides, such as methylene dianiline, diamine, diphenyl sulfone, aminoethyl pyrizine, 2-methyl imidazole dicyan diamide, ethylene diamine, diethylene triamine, triethylene tetraamine, diamino-cyclo-hexane, 4,4-methylene dicyclohexylamine, phenylene diamine, sulfanilamide, aminoethyl-piperizine, 3-(4-hydroxy phenyl)-3-(4-aminophenyl) propane, boron trifluoride mono ethylamine phthalic anhydride, trimellitic anhydride, phromellitic dianhydride, nadic methyl anhydride, and trimellitic acid, and their mixtures. The ratio of the functional groups in molecules of curing agents to the equivalent weight of epoxy groups in resin is 0.5-1.5, and the preferable value is 0.75-1.25.

Besides the modified epoxy resin, brominated epoxy resin, multifunctional epoxy resin and curing agent(s), this invention also comprises one or more curing promoters. The curing promoters adopted include tertiary amines, imidazoles, and the complexes of boron-trifluorides and amines, including 1-methyl imidazole, 2-methyl imidazole, 2-ethyl-4-methyl imidazole, 1-benzyl-2-methyl imidazole, benzyl dimethyl amine, triethyl amine, 2,4,6-tris (dimethyl amino methyl) phenol, pyridine, quinoline, pyrazine, hexamethylene tetraamine, boron trifluoride diethyl ether, boron trifluoride triethanol amine, and boron trifluoride monoethylamine. The weight ratio of curing promoters to the whole resin composition is 0.0001 to 0.01, and the preferable ratio is 0.001-0.005.

Besides the modified epoxy resin, brominated epoxy resin, multifunctional epoxy resin curing agents and curing promoters as described above, this invention still comprises one or more solvent systems for the preparation of resin solution. The suitable solvents include ketones, alcohols, glycol ethers, aromatic hydrocarbons, aliphatic hydrocarbons, cyclic ethers, halogenated hydrocarbons and amides, including acetone, methyl ethyl ketone, methanol, toluene, benzene, propylene glycol, methyl ethyl, N,N-dimethyl formamide, and 2-methyl cellosolve.

The following examples are used to illustrate the preparation of the composition of this invention. The conditions and chemicals used in each example are just for the explanation of this invention, and will not limit or represent the whole range of this invention. The unit of weight in the examples is "gram"

EXAMPLE 1

This example relates to the preparation of modified bisphenol-A epoxy resin; 50 g of cyanuric acid was charged into a three-necked flask equipped with a mechanical agitator and a heating unit; 250 ml of dioxane was then added. The mixture was stirred continuously and heated to maintain the temperature at 80° C. untill the solution was homogeneous; 418 g of DER 331 epoxy resin then was added while the mixture was kept stirred at the same temperature.

After the reaction system become homogeneous, 0.234 g of trimethyl ammonium chloride then added. Furthermore, the reaction temperature raised while stirring continuously, and the reaction system was refluxed for 3 hours. When the reaction system became transparent and colorless, the reaction stopped. The product (A) thus obtained had molecular weight of 1160 by GPC analysis and its epoxide equivalent weight was 355 by titration, and its viscosity was 560 CPS.

EXAMPLE 2

This example relates to the preparation of impregnating varnish from the modified bisphenol-A epoxy resin. 50 g of the product (A) obtained from example 1 was charged into a mechanically stirred 1000 ml round-bottom flask; 50 g of EPON 1031 and 75 g of DER 542 were then added. Meanwhile, 7.5 g of dicyandiamide was dissolved in 100 ml of 2-methyl cellosolve, and the mixture was added to the reaction flask. The reaction system was kept stirred at 80° C. for one hour. Then 0.2 g of benzyl dimethyl amine was added. Stirring continued while the temperature was maintained at 80° C. for another 2 hours. Then the varnish was obtained with 60% solid content and viscosity of 160-170 CPS. The varnish was used to impregnate 2116 glass cloth to give a B-stage prepreg after a themal treating. 8 sheets of B-stage prepregs were stacked and laminated with two sheets of copper foils on both ends. After being pressed at 180° C. and under 300 psi for 2 hours, copper clad laminate was obtained. The glass transition temperature was determined by TMA to be 195° C. The B-stage prepreg was then used to produce a four-layered laminate. and the PTH hole wall was observed by SEM, which showed little smears on the rough hole wall. The smears can be easily removed in heated alkaline solution at 60° C.

COMPARATIVE EXAMPLE 1

The triazine modified epoxy resin was replaced by DER 661 epoxy resin for a comparision for their effects on Tg and other properties. 50 g of DER 661 epoxy resin was charged into a mechanically stirred 1000 ml round-bottom flask. Then 50 g of EPON 1031 and 75 g of DER 542 were added. Meanwhile, 7.5 g of dicyandiamide was dissolved in 100 ml of 2-methyl cellosolve in advance and added in the flask. The reaction system was kept stirred for one hour with temperature held at 80° C. until the system became homogeneous. Then 0.2 g of benzyl dimethyl amine was added with stirring at 80° C. for another 2 hours, to produce a transparent varnish which was used to impregnate 2116 glass cloth to obtain a B-stage prepreg. The prepreg was laminated following the same procedure as in example 2 to give a C-stage PCB laminates. The smear on this specimen after drilling was found to be much more than that of example 2 wherein a triazine modified epoxy resin was used instead of Der. 661.

EXAMPLE 3 TO 6

Components and quantities of starting materials as shown in Table I were pre-reacted and mixed to obtain thermal resistant resin compositions for printed circuit boards in the same manner as in examples 1 and 2.

The triazine-modified epoxy resin used here was obtained by the following process. A melamine-modified epoxy resin (B) was obtained by mixing and stirring 63 g of melamine with 1235 g of DER 331 epoxy resin, and heating the mixture at 80° C. for 2 hours.

A 2,4-Diamino-6-methyl-S-Triazine-modified epoxy resin(C) was obtained by mixing and stirring 125 g of 2,4-Diamino-6-methyl-S-triazine with 1645 g of Der 331 epoxy resin, and heating the mixture at 120° C. for 2.5 hours.

A 2-4-Diamino-4-phenyl 1-1,3,5-triazine-modified epoxy resin(D) was obtained by mixing and stirring 187 g of this triazine compound with 1645 g of DER 331 epoxy resin, and heating the resulting mixture at 120° C. for one hour.

A N,N-Diallyl melamine-modified epoxy resin (E) was obtained by mixing and stirring 100 g of N,N-Diallyl melamine with 800 g of DER 331 epoxy and heating the resulting mixture at 80° C. for one hour.

TABLE I

| Components And Properties | Example No. | | | | |
|---|---|---|---|---|---|
| | 2 | 3 | 4 | 5 | 6 |
| Modified Epoxy, Type/PBW | A/50 | B/50 | C/50 | D/50 | E/50 |
| | 0.12 equiv. | 0.13 equiv. | 0.125 equiv. | 0.16 equiv. | 0.11 equiv. |
| DER 542/PBW | 75 | 50 | 50 | 50 | 50 |
| EPON 1031/PBW | 50 | 50 | 50 | 50 | 50 |
| DICY/PBW | 7.5 | 9.4 | 9.3 | 10 | 9.0 |
| BDMA[2]/ml | 0.5 | 0.3 | 0.3 | 0.3 | 0.3 |
| Tg[3] °C. | 195 | 175 | 191 | 204 | 215 |

1. Parts by weight.
2. Benzyl dimethyl amine.
3. Determined by TMA with 10° C./min heating rate.

What I claim is:

1. A thermal-resistant resin for printed circuit boards comprising:
   (a) a modified bisphenol epoxy resin comprising:
      (i) at least one bisphenol epoxy resin having at least two reactive epoxide groups, said bisphenol epoxy resin having formula:

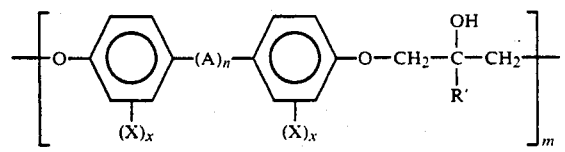
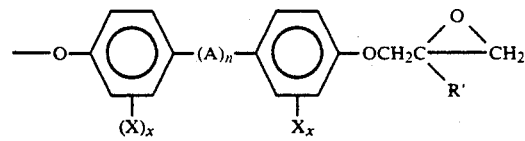

wherein A is a divalent alkylene group with 1 to 10 carbons, or a functional group selected from

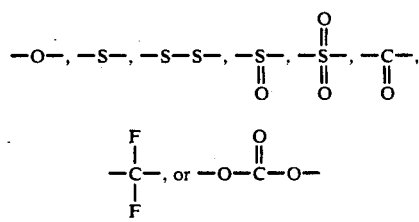

X is a monovalent alkyl group having 1 to 10 carbons, or a halogen, m is a number from 0 to 10, n is 0 or 1, x is 0 to 4, and R' is a hydrogen or an alkyl group with 1 to 4 carbon atoms;

(ii) at least one chain extender having a triazine ring and at least three active hydrogen groups per molecule, represented by the following formula:

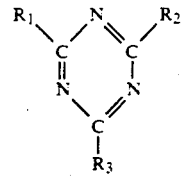

wherein, $R_1$, $R_2$ and $R_3$ can be —OH or —NH$_2$, or $R_1$ and $R_2$ are —NH$_2$, and $R_3$ is a hydrogen atom, a monovalent alkyl with 1-10 carbon atoms; or $R_3$ is a tertiary or secondary amino group;

(iii) optionally, one more catalysts for promoting a reaction between (i) and (ii) above, wherein the weight ratio between said modified epoxy resin and the total weight of the thermal-resistant resin is about 10-100%;

(b) at least one brominated epoxy resin containing 10-50% of bromine based on weight, wherein the weight ratio between said brominated epoxy resin and the total weight of thermal-resistant resin is about 10-50%;

(c) at least one multifunctional epoxy resin, wherein the multifunctional epoxy resin has at least three epoxide groups, and wherein the weight ratio between said multifunctional epoxy resin and said modified epoxy resin is about 0.5-5.0; and (d) at least one curing agent, wherein the ratio between the equivalent of the active group in said curing agent and the equivalent of the epoxide groups of said epoxy resins used is about 0.5-1.5.

2. A thermal-resistant resin composition for printed circuit boards as claimed in claim 1, wherein the weight ratio between said modified epoxy resin and total of said resins of 1(a)-(c) is 25-50%; the weight ratio between said brominated epoxy resin and the total of said resins of 1(a)-(c) is 20-40%; the weight ratio between said multifunctional epoxy resin and the total of said resins of 1(a)-(c) is 30-70%.

3. A resin composition as claimed in claim 1, wherein the ratio of the equivalent of the active groups of said curing agent and the equivalent of the epoxide group of 1(a)-(c) epoxy resins ranges from 0.75-1.25.

4. A resin composition as claimed in claim 1, wherein a curing promoter can be added, the weight ratio between said curing promoter and said resins of 1(a)-(c) being in the range of 0.0001-0.01.

5. A resin composition as claimed in claim 4, wherein the weight ratio between said curing promoter and said resins of 1(a)-(c) is in the range of 0.001-0.005.

6. A resin composition as claimed in claim 1, wherein one or more solvent systems can be present.

7. A resin composition as claimed in claim 4, wherein one or more solvent systems can be present.

8. A resin composition as claimed in claim 1, wherein the chain extender can be selected from at least one of Tricyanic acid, 3,4-diamano-6-methyl-s-triazine, or Melamine.

9. A modified thermal-resistant resin composition as claimed in claim 1, wherein the catalyst for the chain-extending reaction is selected from the group consisting of quaternary phosphonium salts, quaternary ammonium salts and tertiary amines.

10. A resin composition as claimed in claim 1, wherein said multifunctional epoxy resin is selected from the group consisting of N,N,N'-tetrakis (2,3-epoxy propyl) -P,P'-methylene dianiline, triglycidyl ether of triphenylene methane, and 4-glycidyloxy-N,N-diglycidyl aniline.

11. A resin composition as claimed in claim 1, wherein said brominated epoxy resin is selected from the group consisting of tetrabromo bisphenol-A epoxy resin and tetrabromo bisphenol-A bisphenol-A epoxy resin.

12. A resin composition as claimed in claim 1, wherein said curing agent is selected from the group consisting of primary amines, secondary amines, polyamides, mercaptans, carboxylic acids, and anhydrides.

13. A resin composition as claimed in claim 4, wherein said curing promoter is selected from the group consisting of tertiary amines, imidazoles, and boron trifluorideamine complexes.

14. A composition as claimed in claim 1, wherein the bisphenol epoxy resin has the formula:

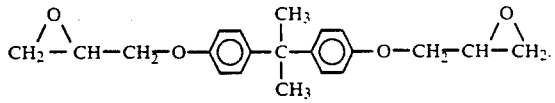

* * * * *